(12) United States Patent (10) Patent No.: US 12,317,460 B2
Rahim et al. (45) Date of Patent: *May 27, 2025

(54) THERMAL MITIGATION FOR AN ELECTRONIC SPEAKER DEVICE AND ASSOCIATED APPARATUSES AND METHODS

(71) Applicant: Google LLC, Mountain View, CA (US)

(72) Inventors: Emil Rahim, San Jose, CA (US);
Chintan Trehan, San Jose, CA (US);
Ihab A. Ali, Cupertino, CA (US);
Wilson Tang, San Francisco, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/504,485

(22) Filed: Nov. 8, 2023

(65) Prior Publication Data
US 2024/0155818 A1 May 9, 2024

Related U.S. Application Data

(63) Continuation of application No. 16/899,148, filed on Jun. 11, 2020, now Pat. No. 11,832,426.

(51) Int. Cl.
*H05K 7/20* (2006.01)
*G01R 31/28* (2006.01)
(Continued)

(52) U.S. Cl.
CPC ..... *H05K 7/20945* (2013.01); *G01R 31/2877* (2013.01); *G06F 3/165* (2013.01);
(Continued)

(58) Field of Classification Search
CPC .......... H04R 9/022; H04R 9/06; H04R 9/025; H04R 9/045; H04R 1/02; H04R 3/007;
(Continued)

(56) References Cited

U.S. PATENT DOCUMENTS 11,832,426 B2* 11/2023 Rahim ................... G06F 1/206
2013/0346778 A1* 12/2013 Boom ................... G06F 1/3225
713/323

(Continued)

*Primary Examiner* — Ahmad F. Matar
*Assistant Examiner* — Sabrina Diaz
(74) *Attorney, Agent, or Firm* — Kilpatrick Townsend & Stockton LLP

(57) ABSTRACT

The present disclosure describes thermal mitigation for an electronic speaker device and associated systems and methods. The thermal mitigation includes monitoring several thermal zones to determine or estimate thermal conditions in corresponding parts of the electronic speaker device. The thermal zones may include a System-on-Chip (SoC) integrated circuit (IC) component, audio components including power-dissipating IC components, and a temperature of an exterior surface of a housing component of the electronic speaker device. To mitigate thermal runaway, different throttling schemes may be triggered based on the thermal zones exceeding certain thermal limits. The throttling schemes may include reducing the amount of power supplied to the SoC, reducing audio power of the audio components to a lower wattage, or manipulating SoC cores such as by disabling one or more of the cores or adjusting utilization of the SoC cores.

20 Claims, 7 Drawing Sheets

(51) Int. Cl.
*G06F 3/16* (2006.01)
*H04R 9/02* (2006.01)
*H05K 1/02* (2006.01)
*H04R 1/02* (2006.01)
*H04R 3/00* (2006.01)

(52) U.S. Cl.
CPC ............ *H04R 9/022* (2013.01); *H05K 1/0203* (2013.01); *H04R 1/02* (2013.01); *H04R 3/007* (2013.01); *H05K 2201/10151* (2013.01)

(58) Field of Classification Search
CPC ......... H01F 7/18; H01F 7/1805; H01H 47/00; H01H 47/04; H01H 47/26; H01L 23/473; H01L 23/467; H01L 23/4093; H05K 1/0206; H05K 1/0203; H05K 3/0061; H05K 3/0058; H05K 7/20545; H05K 7/12; H05K 7/20836; H05K 7/20209; H05K 7/20945; H05K 5/0091; H05K 2201/09781; H05K 2201/10151; G06F 1/20; G06F 1/203; G06F 1/206; G06F 1/2303; G06F 3/165; H02G 15/14; H01R 23/7084; G05D 23/1917; G05D 23/19; Y02B 60/1275; G01R 31/2877
USPC ......... 381/397; 700/299, 300; 361/688, 720, 361/722, 140

See application file for complete search history.

(56) References Cited

U.S. PATENT DOCUMENTS

2014/0006818 A1    1/2014  Doshi et al.
2015/0277454 A1*  10/2015  Carbone ................. G06F 1/206
                                                  700/300
2017/0281010 A1*  10/2017  Saeidi ................... G06F 1/3296
2018/0352329 A1*  12/2018  Klingler ............... H04R 1/2888

* cited by examiner

THERMAL MITIGATION FOR AN ELECTRONIC SPEAKER DEVICE AND ASSOCIATED APPARATUSES AND METHODS

CROSS-REFERENCE TO RELATED APPLICATION

This application is a continuation of U.S. patent application Ser. No. 16/899,148 filed Jun. 11, 2020, entitled "Thermal Mitigation for An Electronic Speaker Device and Associated Apparatuses and Methods," the entire disclosure of which is hereby incorporated by reference, for all purposes, as if fully set forth herein.

BACKGROUND

Electronic speaker devices may perform a variety of functions. Such functions may be related to voice commands spoken to a virtual assistant that is integrated into the electronic speaker device to retrieve information, manage a home-automation system, play media, and so on.

When a form factor of the electronic speaker device is reduced, heat generated from electronic subsystems of the electronic speaker device can result in thermal runaway conditions that damage the electronic subsystems. To manage the heat generated from the electronic subsystems, a thermal-control system may be used. However, the design and architecture of an efficient and effective thermal-control system that prevents the thermal runaway, while maintaining the reduced form factor, may present multiple challenges.

BRIEF SUMMARY

The present disclosure describes thermal mitigation for an electronic speaker device and associated systems and methods. The thermal mitigation includes monitoring several thermal zones to determine or estimate thermal conditions in corresponding parts of the electronic speaker device. The thermal zones may include a System-on-Chip (SoC) integrated circuit (IC) component, audio components including power-dissipating IC components, and a temperature of an exterior surface of a housing component of the electronic speaker device. To mitigate thermal runaway, different throttling schemes may be triggered based on the thermal zones exceeding certain thermal limits. The throttling schemes may include reducing the amount of power supplied to the SoC, reducing audio power of the audio components to a lower wattage, or manipulating SoC cores such as by disabling one or more of the cores or adjusting utilization of the SoC cores.

By monitoring the temperature of critical thermal zones of the electronic speaker device and throttling the power or audio performance of the electronic speaker device as necessary, the audio performance of the electronic speaker device can be increased and the impact on user experience can be reduced.

In aspects, an electronic speaker device is disclosed. The electronic speaker device includes a housing component, one or more speaker modules, and first and second printed circuit boards (PCBs). The first PCB includes audio-power integrated circuit components electrically coupled to the one or more speaker modules. The second PCB includes a SoC integrated circuit component. The SoC integrated circuit component is configured to implement a thermal-mitigation module. The thermal-mitigation module determines a first temperature corresponding to a first thermal zone including the SoC integrated circuit component, a second temperature corresponding to a second thermal zone including a temperature of an exterior surface of the housing component, and a third temperature corresponding to a third thermal zone including the audio-power integrated circuit components. The thermal-mitigation module can then trigger a first throttling scheme or a second throttling scheme. The first throttling scheme reduces an amount of power supplied to the SoC integrated circuit component in response to an indication that the first temperature has exceeded a first threshold temperature or the second temperature has exceeded a second threshold temperature. The second throttling scheme reduces an amount of power supplied to the audio-power integrated circuit components in response to an indication that the third temperature has exceeded a third threshold temperature.

In aspects, a speaker is disclosed. The speaker includes one or more speaker modules, a first PCB, and a second PCB. The first PCB includes audio-power integrated circuit components. The second PCB includes a SoC integrated circuit component, the SoC integrated circuit component configured to implement a thermal-mitigation module. The thermal-mitigation module is configured to permit power to be supplied to the audio-power integrated circuit components up to a first amount of power according to a first-level audio-power mode and determine a temperature corresponding to the audio-power integrated circuit components. The thermal-mitigation module is also configured to select a second-level audio-power mode for the audio-power integrated circuit components in response to the temperature corresponding to the audio-power integrated circuit components exceeding a first threshold temperature. The second-level audio-power mode of the audio-power integrated circuit components permitting a lesser amount of power to be used than the first-level audio-power mode. The thermal-mitigation module is further configured to cause the power supplied to the audio-power integrated circuit components to be limited to a second amount of power corresponding to the second audio-power level mode to reduce the power supplied to, and power dissipated by, the audio-power integrated circuit components.

In aspects, a method for thermal mitigation of an electronic speaker device is disclosed. The method includes determining a first temperature corresponding to an SoC integrated circuit component of the electronic speaker device, a second temperature corresponding to a temperature of an exterior surface of a housing component of the electronic speaker device, and a third temperature corresponding to audio-power integrated circuit components of the electronic speaker device. In addition, the method includes triggering a first throttling scheme or a second throttling scheme. The first throttling scheme reduces power supplied to the SoC integrated circuit component and is triggered in response to an indication that the first temperature has exceeded a first threshold temperature or the second temperature has exceeded a second threshold temperature. The second throttling scheme reduces power supplied to the audio-power integrated circuit components and is triggered in response to an indication that the third temperature has exceeded a third threshold temperature.

This summary is provided to introduce simplified concepts of thermal mitigation for an electronic speaker device, which is further described below in the Detailed Description. This summary is not intended to identify essential features of the claimed subject matter, nor is it intended for use in determining the scope of the claimed subject matter.

BRIEF DESCRIPTION OF THE DRAWINGS

The details of one or more aspects of thermal mitigation for an electronic speaker device are described in this document with reference to the following drawings. The same numbers are used throughout the drawings to reference like features and components.

DETAILED DESCRIPTION

Figure 1:
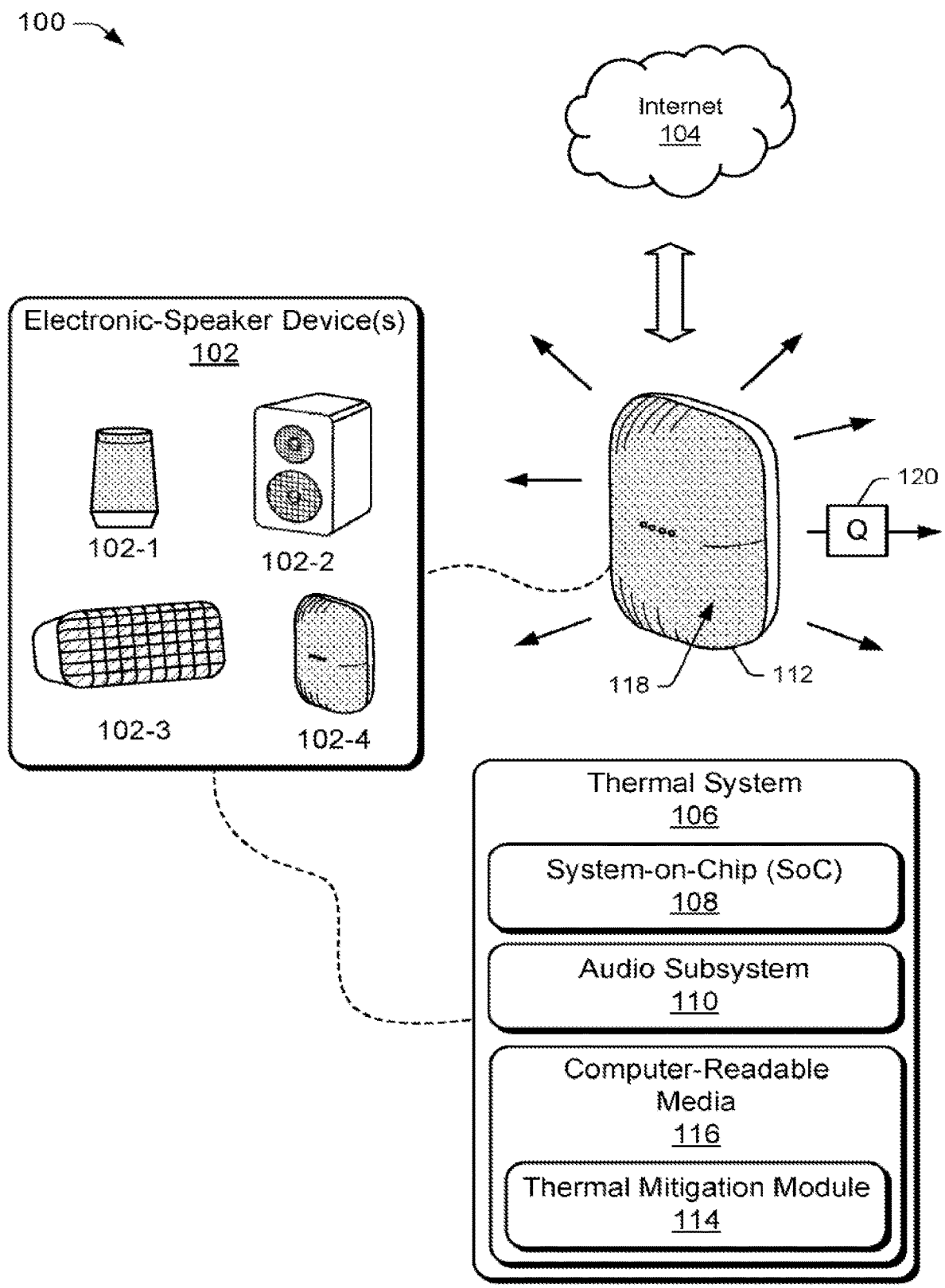
FIG. 1 illustrates an example operating environment having an electronic speaker device in accordance with one or more aspects.

This document describes thermal mitigation for an electronic speaker device. Electronic speaker devices can provide high, competitive audio performance using components with high power dissipation. However, some electronic speaker devices having a small form factor have limited passive cooling capabilities due to their size and are therefore susceptible to creating thermal conditions than can degrade a user experience or permanently damage audio and/or computing components. For example, the exterior surface temperature of the electronic speaker device may become too hot for the user to comfortably touch or the silicon in IC components may be damaged from excessive heat.

The electronic speaker device includes a variety of electronic subsystems that generate heat. Examples of such electronic subsystems include one or more PCBs populated with a variety of IC components, such as an SoC IC component, audio-power IC components, light-emitting diodes, and other heat-dissipating components. A housing component of the electronic speaker device may dissipate the heat to prevent thermal runaway of the electronic subsystems, but for user safety the housing component should not exceed ergonomic temperature limits.

Accordingly, techniques for thermal mitigation for an electronic speaker device are described herein that implement a throttling scheme when any one of three critical thermal zones exceeds a corresponding threshold temperature. Although the thermal mitigation described herein is directed to three thermal zones, any suitable number of thermal zones can be used.

In aspects, the SoC IC component and the audio-power IC components may be separated onto different PCBs. The SoC IC component is located on a PCB referred to herein as a main logic board and the audio-power IC components are located on a PCB referred to herein as an audio-power board. As such, these two critical thermal locations can be treated as first and second thermal zones and the temperature of each zone can be monitored separately. A third thermal zone that is monitored is the skin temperature, which represents the temperature of the exterior surface of the housing of the electronic speaker device.

The thermal zones can be monitored using a proxy temperature for each zone. For example, the temperature of the first thermal zone (e.g., SoC) can be monitored using a junction temperature of the SoC IC component on the main logic board. The temperature of the second thermal zone (e.g., audio-power board) can be monitored using thermistors mounted on the audio-power board to predict the actual temperature of the audio-power IC components on the audio-power board. The temperature of the third thermal zone (e.g., the skin temperature) can be monitored using a virtual sensor described in further detail below to predict the temperature of the exterior surface of the housing.

Each thermal zone has a corresponding thermal limit, or temperature threshold, used to trigger a throttling scheme to mitigate thermal conditions of the thermal zone. One or more of a plurality of throttling schemes can be triggered, depending on the temperature of each thermal zone. The throttling scheme may include reducing the amount of power supplied to the SoC. The throttling scheme may include SoC core manipulation, such as disabling one or more of the cores or reducing a utilization of the cores. The throttling scheme may include reducing the amount of power supplied to the audio-power IC components to a lower wattage to decrease the volume of audio output by the electronic speaker device.

While features and concepts of the described thermal mitigation for an electronic speaker device can be implemented in any number of different environments, aspects are described in the context of the following examples.

FIG. 1 illustrates an example operating environment 100 having an electronic speaker device 102 in accordance with one or more aspects. The electronic speaker device 102, in some aspects, may be a "smart speaker" that uses a voice-activated virtual assistant. The electronic speaker device 102 may connect to the Internet 104 (e.g., through a wireless router) and support a variety of functions, including streaming audio (e.g., music, news, podcasts, sports) and interacting with a virtual assistant to perform tasks (e.g., search the internet, schedule events and alarms, control home automation, control Internet-of-Things (IoT) devices).

The electronic speaker device 102 includes a thermal system 106, which includes several heat-generating, power-dissipating components and thermal-mitigation components. The power-dissipating components include a System-on-Chip (SoC) integrated circuit component ("SoC 108") and an audio subsystem 110, which may include various components such as audio inductors and amplifiers. The thermal-mitigation components may include a heatsink (not shown), positioned within a housing component 112, and a thermal-mitigation module 114 implemented on computer-readable media 116. The housing component 112 may be perforated and include openings through which audio waves can travel (e.g., audio waves originating internally from a speaker of the electronic speaker device 102 or originating externally from a user providing voice commands to the electronic speaker device 102). The housing component 112 may include a plastic material and be formed, for example, using plastic injection molding techniques.

The SoC 108 may be mounted on a PCB. The PCB may be formed, for example, from glass-reinforced epoxy material such as FR4. In some instances, the PCB may include a single layer of electrically-conductive traces and be a single-layer board. In other instances, the PCB may be a multi-layer board that includes multiple layers of electrically-conductive traces that are separated by layers of a dielectric material.

The elements of the thermal system 106, through a combination of heat transfer mechanisms internal to the electronic speaker device 102 (e.g., conduction, convection, and radiation) may transfer energy from the heat-generating components of the electronic speaker device 102 to a shell of the electronic speaker device 102 (e.g., the housing component 112) for dissipation to the ambient environment (e.g., heat "Q" 120 being dissipated using thermal convection).

The thermal-mitigation module 114 is implemented to monitor the temperature of multiple thermal zones and trigger power-throttling schemes in response to an indication that one or more of the thermal zones has exceeded a threshold or critical temperature. In particular, the thermal-mitigation module 114 monitors the temperature of the SoC 108, the temperature of the audio subsystem 110 or a portion of the audio subsystem 110, and the temperature of an exterior surface 118 of the housing component 112.

Figure 2:
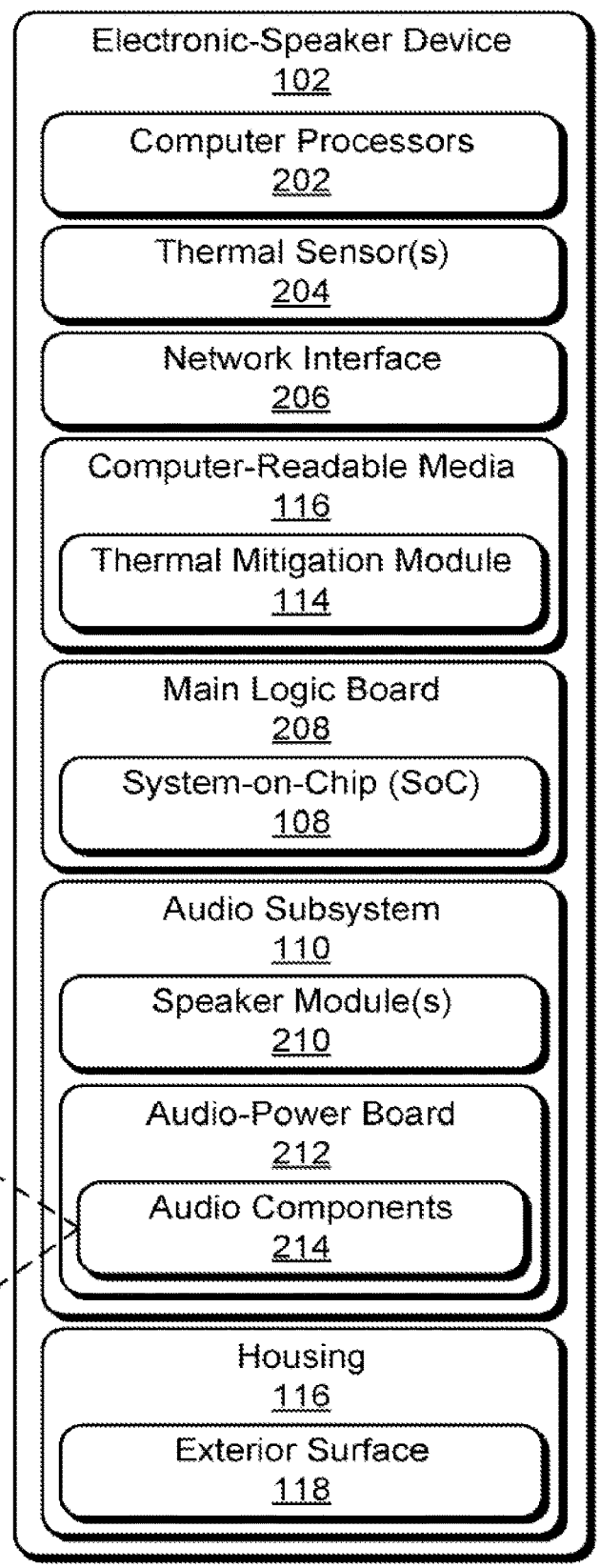
FIG. 2 illustrates an example implementation of the electronic speaker device from FIG. 1 that can implement thermal mitigation.

In more detail, consider FIG. 2, which illustrates an example implementation 200 of the electronic speaker device 102 that can implement thermal mitigation. The electronic speaker device 102 includes one or more computer processors 202 and one or more computer-readable media 116, which includes non-transitory memory media and non-transitory storage media. Applications and/or an operating system (not shown) implemented as computer-readable instructions stored on the computer-readable media 116 can be executed by the computer processors 202 to provide some or all of the functionalities described herein. For example, the computer-readable media 116 can include the thermal-mitigation module 114. The thermal-mitigation module 114 is configured to monitor several thermal zones using one or more thermal sensors 204, such as thermistors, resistance temperature detectors, thermocouples, silicone-based sensors, or other temperature sensors. The thermal-mitigation module 114 is also configured to implement one or more throttling schemes to mitigate thermal conditions of the thermal zones.

The electronic speaker device 102 may also include a network interface 206. The electronic speaker device 102 can use the network interface 206 for communicating data over wired, wireless, or optical networks. By way of example and not limitation, the network interface 206 may communicate data over a local-area-network (LAN), a wireless local-area-network (WLAN), a personal-area-network (PAN), a wide-area-network (WAN), an intranet, the Internet, a peer-to-peer network, point-to-point network, or a mesh network.

Various implementations of the electronic speaker device 102 can include an SoC, such as the SoC 108, one or more ICs, a processor with embedded processor instructions or configured to access processor instructions stored in memory, hardware with embedded firmware, a printed circuit board with various hardware components, or any combination thereof. The SoC 108 can be mounted to a PCB, such as a main logic board 208.

The electronic speaker device 102 also includes the audio subsystem 110, which includes one or more speaker modules 210 and an audio-power board 212. The speaker modules may include multiple loudspeakers, such as a woofer and a tweeter. The audio-power board 212 is a PCB that includes several audio components 214 (audio-power IC components), such as one or more audio inductors 216 and one or more audio amplifiers 218, which dissipate power as a function of audio performance. The audio components 214 are electrically coupled to the one or more speaker modules 210. The audio-power board 212 may be separate and individual from the main logic board 208 that supports the SoC 108.

The multiple heat-generating, electronic devices may be mounted to the PCBs of the electronic speaker device 102 and connected to the electrically-conductive traces using surface mount and/or through-hole solder techniques. As above, the audio amplifiers and audio inductors may be mounted on a PCB that is separate from the main logic board on which the SoC IC component is mounted. In some instances, the PCBs may also include an electromagnetic interference (EMI) shield that surrounds heat-generating devices such as the SoC 108 and the audio components 214 on the audio-power board 212.

In general, the PCBs (including the multiple heat-generating, electronic devices) may be considered an electronic subassembly of the electronic speaker device 102. While the electronic speaker device 102 is operating, the multiple heat-generating electronic devices may generate heat at a rate (e.g., watts) that, if not dissipated quickly, can damage the electronic speaker device 102.

This damage-causing situation, referred to as thermal runaway, can have destructive impacts to the electronic speaker device 102 that include, for example, delamination of the PCB and/or shortened life of components of the electronic speaker device 102 (e.g., the SoC IC component, the memory components, the audio amplifiers, audio inductors, Wi-Fi components, and communication interfaces). In some instances, an operating temperature of the electronic speaker device 102 may exceed a critical threshold, causing the electronic speaker device 102 to simply shut down (e.g., a thermocouple or other temperature sensing device may provide feedback to a processor or temperature control unit of the electronic speaker device 102 and cause a thermal shut down).

Various electronic devices may have a thermal-control system, including different combinations of heatsinks, fans, heat spreaders, and thermal interface materials to conduct heat from electronic subsystems of the electronic speaker device 102. However, in devices with a small form factor, and in some environmental conditions, these thermal-control systems may be insufficient to maintain the temperature of critical components within a safe range. Here, the thermal-mitigation module 114 mitigates the rise in temperature of critical components during high-performance audio output by throttling the power supplied to one or more power-dissipating components, which enables continued audio performance of the electronic speaker device 102 at a lower power level but with high-quality audio performance.

Figure 3:
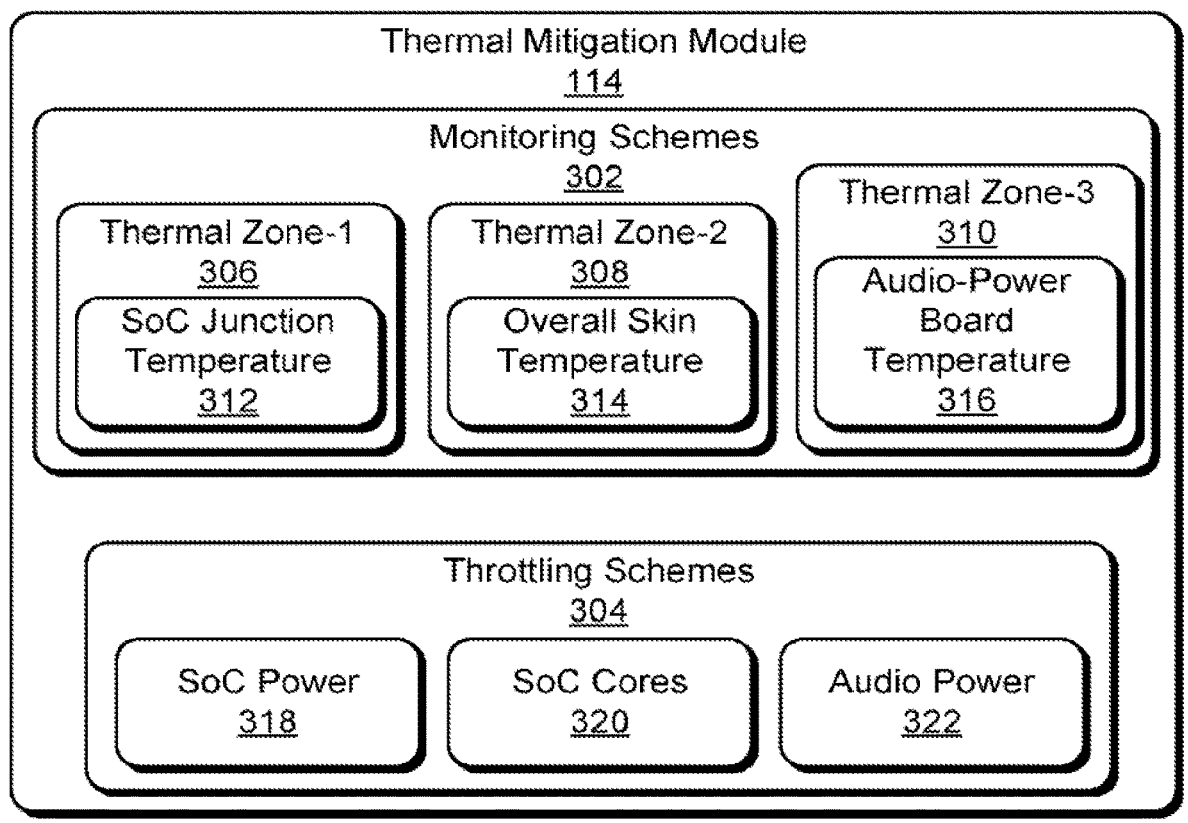
FIG. 3 illustrates the thermal-mitigation module from FIG. 1 in more detail.

FIG. 3 illustrates the thermal-mitigation module 114 from FIGS. 1 and 2 in more detail. In particular, FIG. 3 illustrates example monitoring schemes 302 and throttling schemes 304 implemented by the thermal-mitigation module 114. In the illustrated example, the monitoring schemes 302 include the monitoring of several thermal zones, such as thermal zone-1 306, thermal zone-2 308, and thermal zone-3 310. Additional thermal zones may also be monitored. The thermal zone-1 306 includes the SoC 108 and may be represented by the junction temperature of the SoC ("SoC junction temperature 312", "$T_j$"). The thermal zone-2 308 includes the touchable exterior surface of the housing component 112 of the electronic speaker device 102 and may be represented by an estimate of the exterior-surface temperature ("skin temperature 314", "$T_s$"). The thermal zone-3 310 includes the temperature of the audio components on the audio-power board 212 and may be represented by an audio-power board temperature 316 ("$T_{PB}$"). Additional temperature measurements may be detected, including a temperature $T_{MLB}$ of the main logic board 208 based on an associated negative temperature coefficient (NTC), and a temperature of an internal temperature sensor of the audio amplifier 218.

The temperature of each thermal zone is determined by using a respective proxy. The proxy of the thermal zone-1 306 is the junction temperature on the internal diodes of the SoC 108. The proxy for the thermal zone-2 308 is a virtual sensor that uses an algorithm to estimate the skin temperature 314 based on an aggregation of various temperature measurements including the SoC junction temperature $T_j$ 312, the audio-power board temperature $T_{PB}$ 316, and a temperature $T_{MLB}$ of the main logic board 208. The skin temperature $T_s$ 314 can be determined using the following equation:

$$T_s = a(T_{MLB}) + b(T_{PB}) + c(T_j) + d \qquad \text{Equation 1}$$

where the terms a, b, c, and d, are weights (constants) used to enable the combination of temperatures to provide an estimate of the skin temperature $T_s$ 314. Using such a virtual sensor enables the system to frequently sample the skin temperature $T_s$ 314 while the user is using the electronic speaker device 102 and without interrupting the audio performance of the electronic speaker device 102. The proxy for the thermal zone-3 310 is one or more thermistors mounted on the audio-power board 212 proximate to the audio components 214.

In aspects, a correlation between a particular component's temperature and the thermal sensors 204 can be programmed in system firmware of the electronic speaker device 102 to enable the thermal-mitigation module 114 to predict the temperature of each thermal zone and trigger one or more of the throttling schemes 304 in response to a component temperature exceeding an associated threshold temperature or within a margin of the associated threshold temperature.

The throttling schemes 304 include throttling or adjusting SoC power 318 supplied to the SoC to reduce the power dissipated by the SoC 108. Another throttling scheme 304 includes manipulating SoC cores 320 of the SoC 108, such as by disabling or deactivating one or more, but less than all, of the SoC cores 320 or by reducing a utilization of the SoC cores 320. Yet another throttling scheme 304 includes throttling or adjusting audio power 322 supplied to the audio components 214 on the audio-power board 212 to reduce the power dissipated by the audio components 214, particularly the audio amplifier 218 and audio inductor 216. The throttling schemes 304 and the monitoring schemes 302 are described in more detail below with respect to FIGS. 4-7.

Example Methods

Figure 4:
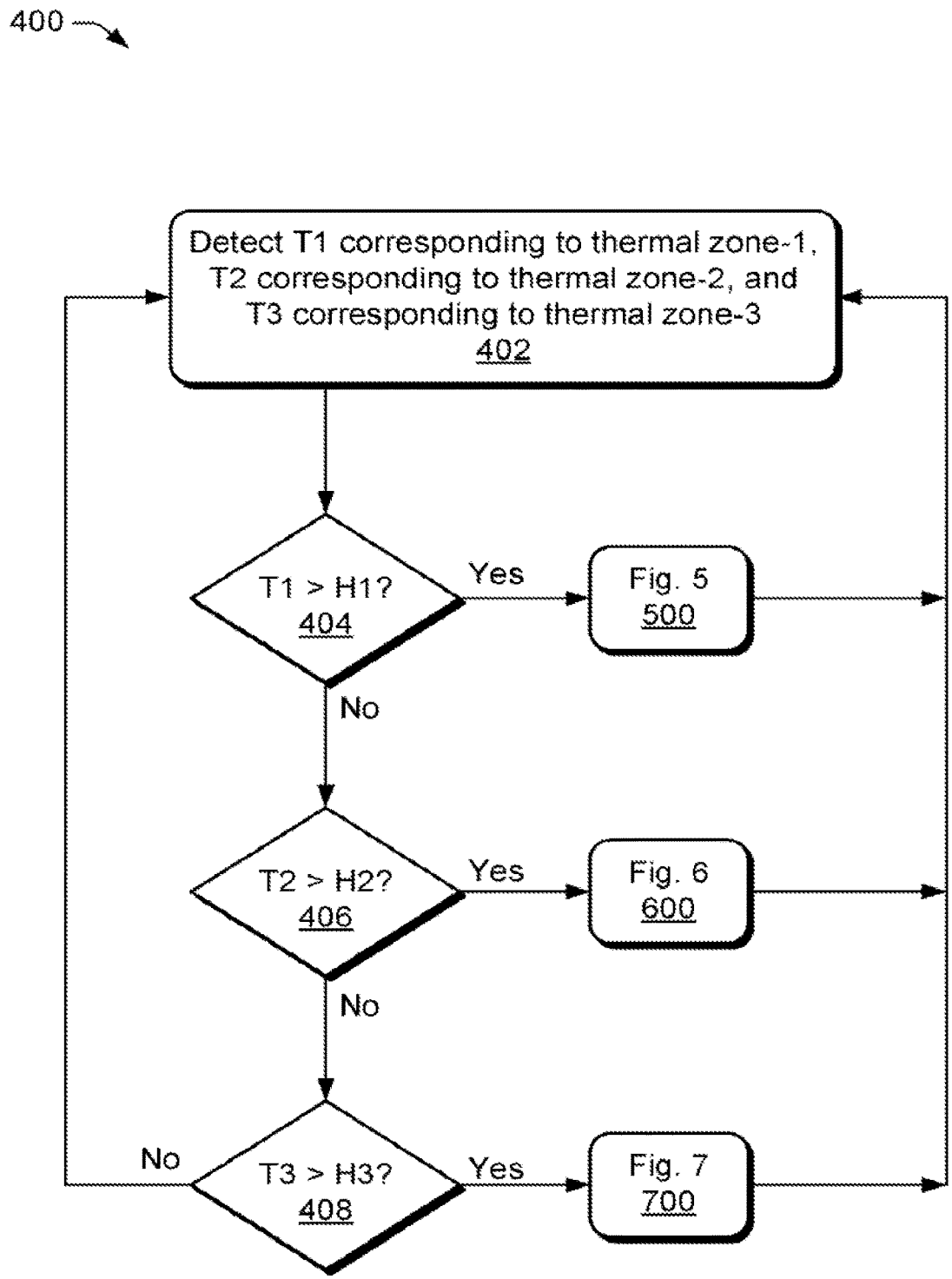
FIG. 4 depicts a method for thermal mitigation using different throttling schemes for different thermal conditions.
Figure 5:
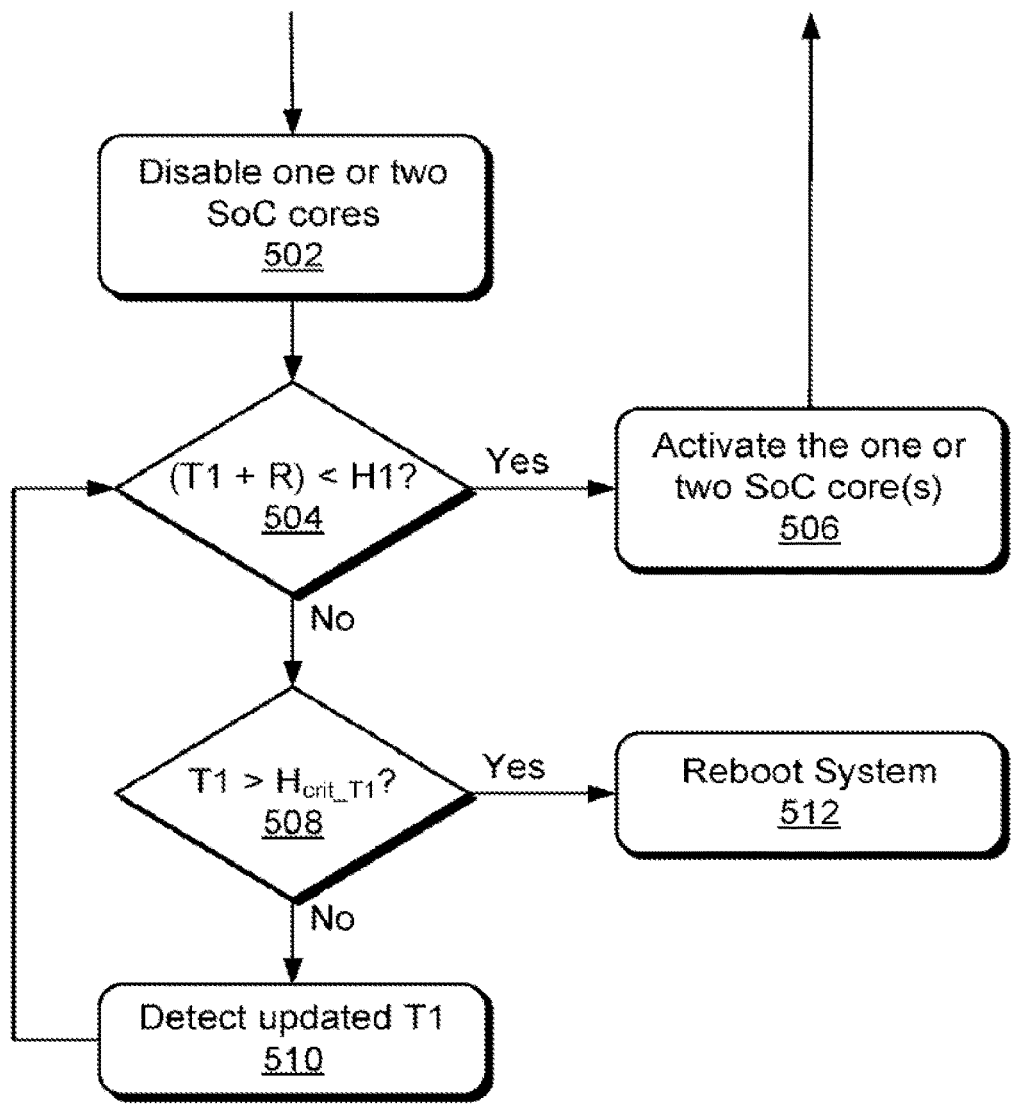
FIG. 5 depicts an SoC-based throttling scheme for thermal mitigation of the SoC of the electronic speaker device.
Figure 6:
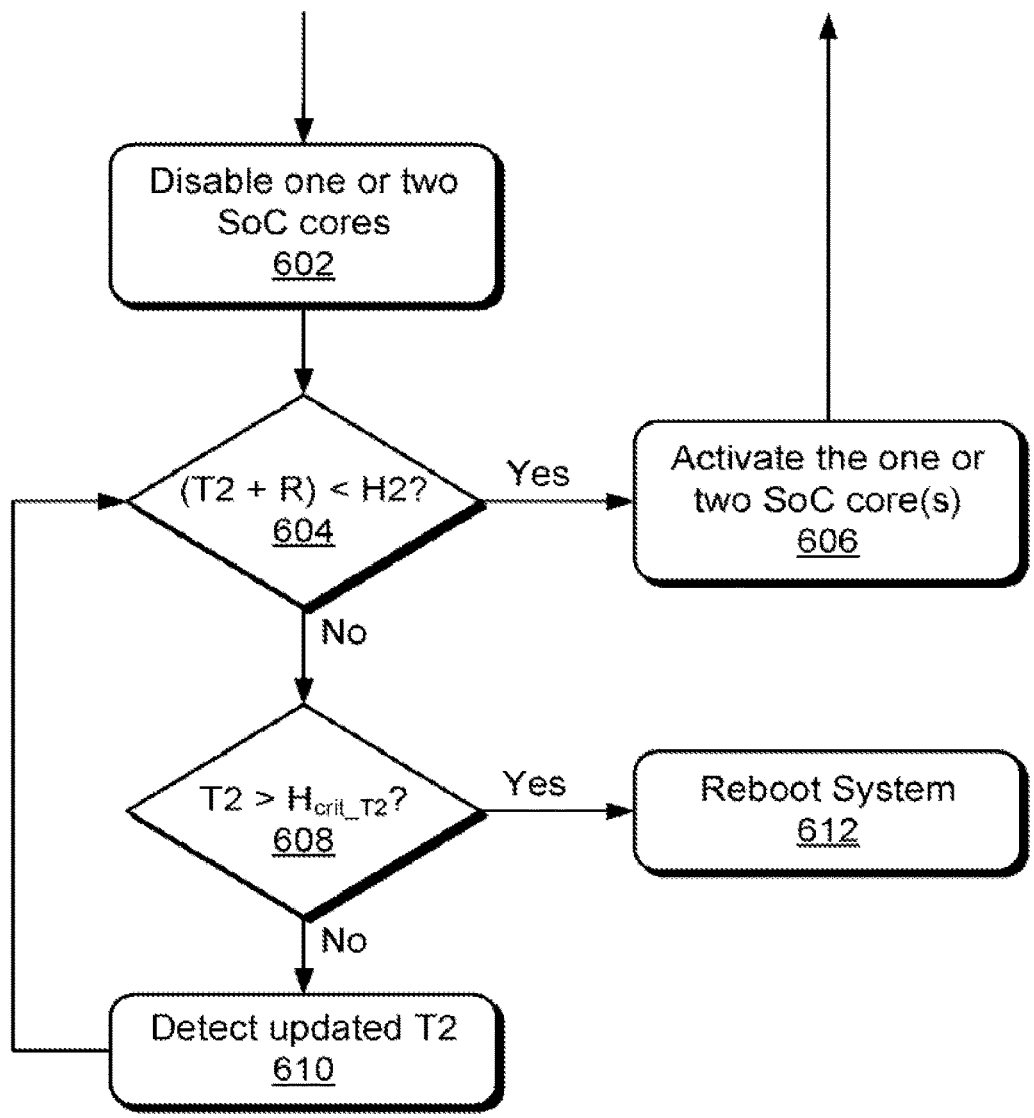
FIG. 6 depicts a skin-based throttling scheme for thermal mitigation of the exterior surface of the housing of the electronic speaker device.
Figure 7:
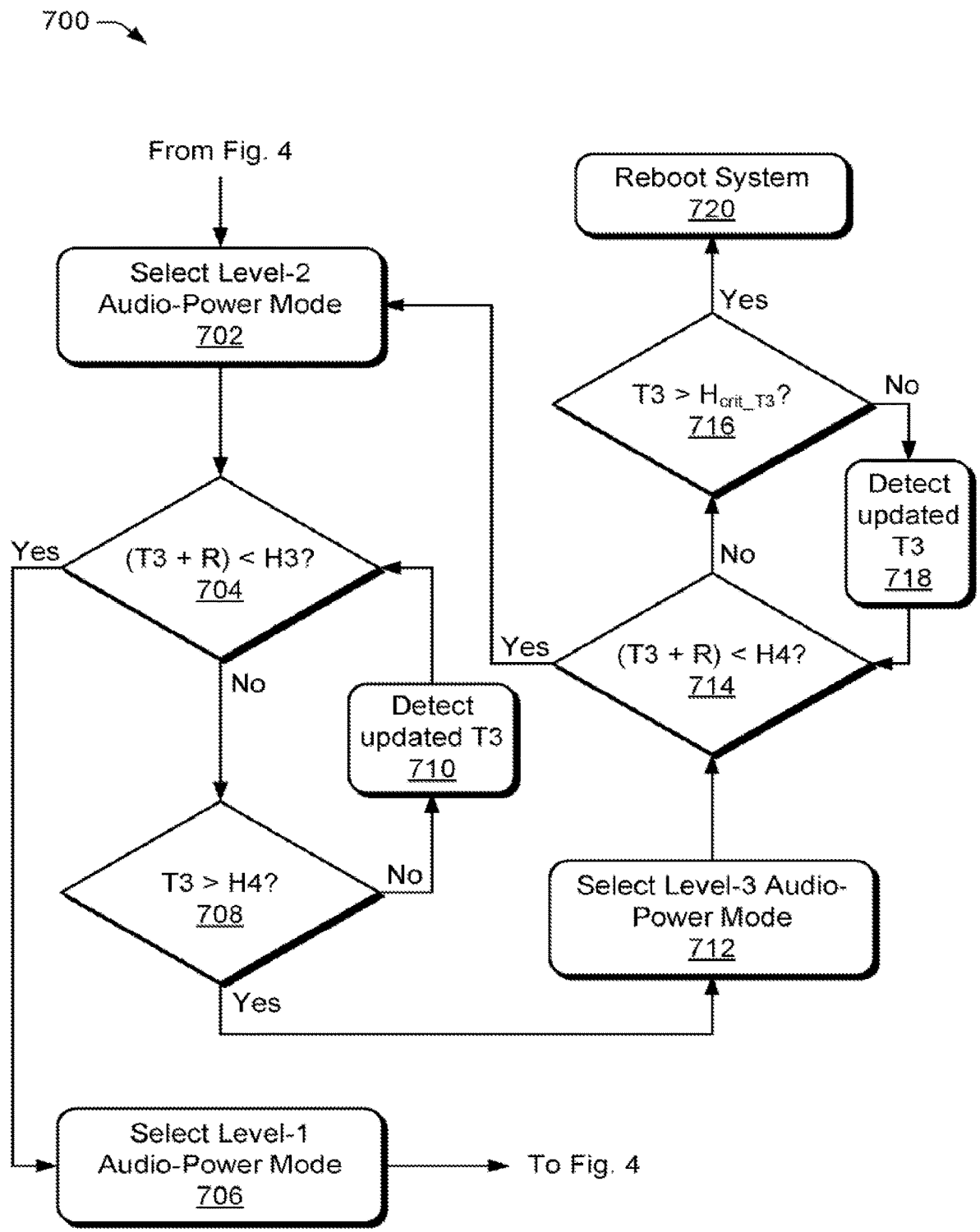
FIG. 7 depicts an audio-based throttling scheme for thermal mitigation of the audio components of the electronic speaker device.

FIGS. 4, 5, 6, and 7, respectively depict example methods 400, 500, 600, and 700 for thermal mitigation of an electronic speaker device. The methods 400, 500, 600, and 700 can be performed by the electronic speaker device 102, which uses the thermal-mitigation module 114 to trigger a throttling scheme when thermal conditions of a critical component of the electronic speaker device 102 exceed a temperature threshold. FIG. 4 depicts a method for thermal mitigation using different throttling schemes for different thermal conditions, each of which are further detailed in methods 500, 600, and 700, respectively. The method 500 of FIG. 5 depicts an SoC-based throttling scheme for thermal mitigation of the SoC of the electronic speaker device. The method 600 of FIG. 6 depicts a skin-based throttling scheme for thermal mitigation of the exterior surface of the housing of the electronic speaker device. The method 700 of FIG. 7 depicts an audio-based throttling scheme for thermal mitigation of the audio components of the electronic speaker device.

The methods 400, 500, 600, and 700 are each shown as a set of blocks that specify operations performed but are not necessarily limited to the order or combinations shown for performing the operations by the respective blocks. Further, any of one or more of the operations may be repeated, combined, reorganized, or linked to provide a wide array of additional and/or alternate methods. In portions of the following discussion, reference may be made to the example operating environment 100 of FIG. 1 or to entities or processes as detailed in FIGS. 2 and 3, reference to which is made for example only. The techniques are not limited to performance by one entity or multiple entities operating on one device.

In FIG. 4 and at 402, the thermal-mitigation module 114 detects a first temperature T1 corresponding to thermal zone-1, a second temperature T2 corresponding to thermal zone-2, and a third temperature T3 corresponding to thermal zone-3. At 404, 406, and 408, the thermal-mitigation module 114 compares each of the temperatures T1, T2, and T3 to threshold temperatures H1, H2, and H3, respectively.

At 404, the thermal-mitigation module 114 determines whether the first temperature T1 is greater than a first threshold H1. The first temperature T1 can be determined by using a temperature sensor corresponding to the thermal zone-1, such as the junction temperature of the SoC. The first threshold H1 can be any suitable threshold, such as approximately 92° C., which may be based on a +/−3° C. diode accuracy tolerance and an SoC-specification limit of 95° C. If the first temperature T1 is less than the first threshold temperature H1 ("NO" at 404), then the method 400 returns to 402 and thermal-mitigation module 114 continues to monitor the temperature of the thermal zone-1.

At 406, the thermal-mitigation module 114 determines whether the second temperature T2 is greater than a second threshold H2. The second threshold H2 can be any suitable threshold temperature, such as approximately 52° C., which may be based on a +/−3° C. diode accuracy tolerance and an ergonomic limit of 55° C. This particular threshold temperature may correspond to any suitable ergonomic limit selected for a user experience in touching a user-touchable surface, such as the exterior surface of the housing of the electronic speaker device 102. If the second temperature T2 is less than the second threshold temperature H2 ("NO" at 406), then the method 400 returns to 402 and thermal-mitigation module 114 continues to monitor the temperature of the thermal zone-2.

At 408, the thermal-mitigation module 114 determines whether the third temperature T3 is greater than a third threshold temperature H3. The third threshold temperature H3 can be any suitable threshold temperature, such as approximately 73° C., which may be based on a +/−3° C. diode accuracy tolerance and a specification limit of 55° C. for the audio components 214 (e.g., the audio amplifier(s) 218 and/or the audio inductor(s) 216). This particular threshold is used to protect the audio components 214 on the audio-power board 212 from damage caused by excessive heat. If the third temperature T3 is less than the third threshold temperature H3 ("NO" at 408), then the method 400 returns to 402 and thermal-mitigation module 114 continues to monitor the temperature of the thermal zone-3.

If the first temperature T1 is greater than the first threshold temperature H1 ("YES" at 404), then the method 400 proceeds to the method 500 in FIG. 5 in which the thermal-mitigation module 114 triggers a first throttling scheme, which reduces power input to the SoC to decrease the first temperature T1. If the second temperature T2 is greater than the second threshold temperature H2 ("YES" at 406), then the method 400 proceeds to the method 600 in FIG. 6 in which the thermal-mitigation module 114 triggers the first throttling scheme, which reduces power input to the SoC to decrease the second temperature T2.

If the third temperature T3 is greater than the third threshold temperature H3 ("YES" at 408), then the method 400 proceeds to the method 700 in FIG. 7 in which the thermal-mitigation module 114 triggers a second throttling scheme that reduces power input to the audio components 214 to decrease the third temperature T3. In an example, the power input to the audio components can be reduced by an amount sufficient to lower the audio output by approximately 3 decibels (dB).

In FIG. 5 and at 502, the thermal-mitigation module 114 disables one or two computer processing unit (CPU) cores 320 of the SoC 108. Disabling or deactivating one or two SoC cores 320 reduces the amount of heat generated by the SoC 108, enabling the temperature of the SoC 108 to decrease.

Subsequent to disabling one or two of the SoC cores 320, the thermal-mitigation module 114 continues to monitor the first temperature T1 (e.g., SoC junction temperature $T_j$ 312). At 504, the thermal-mitigation module 114 determines whether the first temperature T1 has decreased to at least a stable-temperature threshold, which is a value that is less than the first threshold temperature H1 by more than a tolerance temperature R. If the first temperature T1 has cooled to such a temperature ("YES" at 504), then at 506, the thermal-mitigation module 114 activates the disabled SoC cores to enable the SoC 108 to operate at full utilization and the method 500 returns to 402 in FIG. 4. In an example, if the SoC junction temperature Tj 312 drops below approximately 87° C., which is 5° C. below the threshold 92° C., then the disabled SoC cores can be activated. Any suitable tolerance temperature R can be used, examples of which include approximately 2° C., approximately 3° C., approximately 4° C., approximately 5° C., and so on. Using such a tolerance temperature R can provide hysteresis to prevent the thermal-mitigation module 114 from disabling and enabling the SoC cores 320 too frequently.

If the first temperature T1 has not dropped below the first threshold temperature H1 by at least the tolerance R ("NO" at 504), then at 508, the thermal-mitigation module 114 determines whether the first temperature T1 exceeds a critical-temperature threshold T1 for the SoC 108. The critical-temperature threshold $H_{crit\_T1}$ is selected as a maximum temperature for the SoC 108 to safely operate without experiencing damaging effects from the excessive heat. An example critical-temperature threshold $H_{crit\_T1}$ is approximately 100° C. If the first temperature T1 remains below the critical-temperature threshold $H_{critT1}$ ("NO" at 508), then at 510, thermal-mitigation module 114 continues to monitor the first temperature T1 while the SoC 108 operates with one or two less cores than when operating at full capacity by detecting an updated first temperature T1 and returning to 504 to compare the updated first temperature T1 to the first threshold temperature H1.

If the first temperature Ti exceeds the critical-temperature threshold $H_{crit\_T1}$ ("YES" at 508), then at 512, the thermal-mitigation module 114 initiates a reboot of the system to prevent critical damage to the SoC 108 from the excessive heat. A system reboot shuts down the SoC 108, which prevents the SoC 108 from generating additional heat.

In FIG. 6 and at 602, disables one or two of the SoC cores 320 of the SoC 108. Disabling or deactivating one or two SoC cores 320 reduces the amount of heat generated by the SoC 108, potentially enabling the second temperature T2 (e.g., the skin temperature $T_s$, 314) to decrease.

Subsequent to disabling one or two of the SoC cores 320, the thermal-mitigation module 114 continues to monitor the second temperature T2. At 604, the thermal-mitigation module 114 determines whether the second temperature T2 has decreased to at least a stable-temperature threshold, which is a value that is less than the second threshold temperature H2 by more than a tolerance temperature R. If the second temperature T2 has cooled to such a temperature ("YES" at 604), then at 606, the thermal-mitigation module 114 activates the disabled SoC cores to enable the SoC 108 to operate at full utilization and the method 600 returns to 402 in FIG. 4. In an example, if the second temperature T2 drops below approximately 47° C., which is 5° C. below the threshold 52° C., then the disabled SoC cores can be activated. Any suitable tolerance temperature R can be used, examples of which include approximately 2° C., approximately 3° C., approximately 4° C., approximately 5° C., and so on. The tolerance temperature R provides hysteresis to prevent the thermal-mitigation module 114 from disabling and enabling the SoC cores 320 too frequently.

If the second temperature T2 has not dropped below the second threshold temperature H2 by at least the tolerance R ("NO" at 608), then at 608, the thermal-mitigation module 114 determines whether the second temperature T2 exceeds a critical-temperature threshold $H_{crit\_T2}$. The critical-temperature threshold $H_{crit\_T2}$ is selected as a maximum temperature for the SoC 108 to safely operate without experiencing damaging effects of the excessive heat. An example critical-temperature threshold $H_{critT2}$ for the second temperature T2 (e.g., skin temperature $T_s$ 314) is approximately 57° C. If the second temperature T2 remains below the critical-temperature threshold $H_{critT2}$ ("NO" at 608), the thermal-mitigation module 114 continues to monitor the second temperature T2 while the SoC 108 operates with one or two less cores than when operating at full capacity by detecting an updated second temperature T2 and returning to 604 to compare the updated second temperature T2 to the second threshold temperature H2.

If the second temperature T2 exceeds the critical-temperature threshold $H_{critT2}$ ("YES" at 608), then at 610, the thermal-mitigation module 114 initiates a reboot of the system to prevent critical damage to the SoC 108 by excessive heat. A system reboot shuts down the SoC 108, which prevents the SoC 108 from generating additional heat.

In FIG. 7, the thermal-mitigation module 114 triggers a second throttling scheme that reduces power input to the audio components 214 to decrease the third temperature T3. At 702, the thermal-mitigation module 114 selects a second level ("level-2") audio-power mode to reduce the power supplied to the audio components from a first level ("level-1") audio-power mode, which permits a first amount of power (e.g., full-power level of up to approximately 9.0 watts), to a second amount of power corresponding to the level-2 audio-power mode, which permits a lesser amount of power than the level-1 audio-power mode. Selecting the level-2 audio-power mode throttles or reduces power input to the audio components 214 to a moderate-power level, which reduces the amount of heat dissipated by the audio components 214.

In an example, the level-2 audio-power mode can limit the power supplied to the audio components 214 to between 5.5 watts and 8 watts, such as approximately 7.0 watts. Reducing the power input to the audio components 214 (e.g., from approximately 9.0 watts to approximately 7.0 watts) mitigates thermal conditions of the audio components 214 by decreasing the amount of heat dissipated by the audio components 214 to allow the third temperature T3 (e.g., the audio-power board temperature $T_{PB}$ 3 16) an opportunity to decrease. The reduction in the power input to the audio components 214 results in a decrease in output volume of the speaker module 210.

At 704 and during the level-2 audio-power mode, the thermal-mitigation module 114 continues to monitor the third temperature T3 and determines whether the third temperature T3 has decreased to a stable-temperature threshold, which is a temperature that is less than the third threshold temperature H3 by more than a tolerance temperature R. If the third temperature T3 has decreased to such a value ("YES"), then at 706, the thermal-mitigation module 114 selects the level-1 audio-power mode to permit the power to be supplied to the audio components 214 up to the first amount of power corresponding to the level-1 audio-power mode and returns to 402 in FIG. 4. Selecting the level-1 audio-power mode can permit the audio performance to return to full power (e.g., approximately 9.0 watts). Any suitable tolerance temperature R can be used, examples of which include approximately 2° C., approximately 3° C., approximately 4° C., approximately 5° C., and so on. Using such a tolerance temperature R can prevent the thermal-mitigation module 114 from toggling back-and-forth between audio-power modes too frequently.

If the third temperature T3 has not dropped below the third threshold temperature H3 by at least the tolerance R ("NO" at 704), then at 706, the thermal-mitigation module 114 determines whether the third temperature T3 exceeds an upper-threshold temperature 114, which is higher than the third threshold temperature H3. If the third temperature T3 is below the upper-threshold temperature H4 ("NO" at 708), then at 710 the thermal-mitigation module 114 continues to monitor the third temperature T3 for thermal conditions during the level-2 audio-power mode by detecting an updated third temperature T3 and returning to 704 to compare the updated third temperature T3 to the third threshold temperature H3.

If the third temperature T3 of the audio components exceeds the upper-threshold temperature H4 ("YES" at 708), then at 712, the thermal-mitigation module 114 selects a third level ("level-3") audio-power mode cause the power supplied to the audio components 214 to change from the second amount of power corresponding to the level-2 audio-power mode to a third amount of power corresponding to the level-3 audio-power mode. This throttling reduces the power input to the audio components 214 to a low-power level. For example, external thermal conditions, such as solar radiation or other environmental conditions, may provide additional heat to the exterior surface 118 of the electronic speaker device 102, which may overwhelm the device's thermal-control system (e.g., heatsinks, fans, heat spreaders, thermal interface materials, etc.) and prevent the critical components of the electronic speaker device 102 from cooling down while operating at the current level of power-dissipation. The level-3 audio-power mode throttles the power input to the audio components 214 to a wattage that is lower than the level-2 audio-power mode. In an example, the level-3 audio-power mode can limit the power supplied to the audio components 214 to between 3 and 5.5 watts, such as approximately 4.4 watts. Accordingly, the level-3 audio-power mode provides a significant reduction in the amount of power supplied to the audio components 214 to further mitigate thermal conditions of the audio components 214 and further reduce the amount of heat dissipated by the audio components 214.

At 714 and during the level-3 audio-power mode, the thermal-mitigation module 114 continues to monitor the third temperature T3 and determines whether the third temperature T3 has decreased to a value that is below the upper-threshold temperature H4 by more than the tolerance R. If the third temperature T3 has dropped below such a value ("YES" at 714), then the method 700 returns to 702 and the thermal-mitigation module 114 selects the level-2 audio-power mode to permit the power to be supplied to the audio components 214 up to the second amount of power corresponding to the level-2 audio-power mode. Selecting the level-2 audio-power mode can enhance the audio performance and return the amount of power supplied to the audio components 214 to a moderate level. In an example, the amount of power supplied to the audio components is increased from approximately 4.4 watts to approximately 7.0 watts. The tolerance R may be the same value as the tolerance R used at 704, or it may be a different value.

If the third temperature T3 has not dropped below the upper-threshold temperature H4 by at least the tolerance R ("NO" at 714), then at 716, the thermal-mitigation module 114 determines whether the third temperature T3 exceeds a critical-temperature threshold $H_{crit\_T3}$ for the audio-power board 212. If the third temperature T3 is below the critical-temperature threshold $H_{crit\_T3}$ ("NO" at 716), then at 718 the thermal-mitigation module 114 continues to monitor the third temperature T3 for thermal conditions during the level-3 audio-power mode by detecting an updated third temperature T3 and returning to 714 to compare the updated third temperature T3 to the fourth threshold temperature 114.

If the third temperature T3 exceeds the critical-temperature threshold $H_{crit\_T3}$ ("YES" at 716), then at 720, the thermal-mitigation module 114 triggers a reboot of the system to essentially disable the heat-dissipating components of the electronic speaker device 102 and prevent permanent and/or catastrophic damage that could result from a further increase in the thermal conditions of the audio components 214.

Generally, any of the components, modules, methods, and operations described herein can be implemented using software, firmware, hardware (e.g., fixed logic circuitry), manual processing, or any combination thereof. Some operations of the example methods may be described in the general context of executable instructions stored on computer-readable storage memory that is local and/or remote to a computer processing system, and implementations can include software applications, programs, functions, and the like. Alternatively or in addition, any of the functionality described herein can be performed, at least in part, by one or more hardware logic components, such as, and without limitation, Field-programmable Gate Arrays (FPGAs), Application-specific Integrated Circuits (ASICs), Application-specific Standard Products (AS SPs), SoC systems, Complex Programmable Logic Devices (CPLDs), and the like.

The following paragraphs recite several examples.

Example 1: An electronic speaker device comprising: a housing component; one or more speaker modules; a first PCB comprising audio-power integrated circuit components electrically coupled to the one or more speaker modules; and a second PCB comprising an SoC integrated circuit component, the SoC integrated circuit component configured to implement a thermal-mitigation module configured to: determine a first temperature corresponding to a first thermal zone including the SoC integrated circuit component, a second temperature corresponding to a second thermal zone including a temperature of an exterior surface of the housing component, and a third temperature corresponding to a third thermal zone including the audio-power integrated circuit components; trigger a first throttling scheme that reduces an amount of power supplied to the SoC integrated circuit component in response to an indication that the first temperature has exceeded a first threshold temperature or the second temperature has exceeded a second threshold temperature; and trigger a second throttling scheme to reduce an amount of power supplied to the audio-power integrated circuit components in response to an indication that the third temperature has exceeded a third threshold temperature.

Example 2. The electronic speaker device of example 1, wherein the first temperature corresponding to the first thermal zone is determined using a junction temperature of the SoC integrated circuit component.

Example 3. The electronic speaker device of example 2, wherein the third temperature corresponding to the third thermal zone is determined using one or more thermal sensors mounted on the first PCB.

Example 4. The electronic speaker device of example 3, wherein the second temperature corresponding to the temperature of the exterior surface of the housing component is estimated using a virtual sensor that uses an aggregation of temperature measurements from the junction temperature of the SoC integrated circuit component, the one or more thermal sensors of the first PCB, and additional temperature sensors on a main logic board of the electronic speaker device.

Example 5. The electronic speaker device of example 1, wherein the second throttling scheme reduces the amount of power supplied to the audio-power integrated circuit components from a full-power level of approximately 9.0 watts to a moderate-power level of approximately 7.0 watts.

Example 6. The electronic speaker device of example 1, wherein the amount of power supplied to the audio-power integrated circuit components is reduced to cause an output volume of the one or more speaker modules to decrease by approximately 3 decibels.

Example 7. The electronic speaker device of example 1, wherein the thermal-mitigation module is configured to trigger, subsequent to the second throttling scheme being triggered and responsive to an additional indication that the third temperature of the audio-power integrated circuit components has exceeded a upper-threshold temperature, a third throttling scheme that further reduces the amount of power supplied to the audio-power integrated circuit components to a low-power level of 3 to 5.5 watts.

Example 8. The electronic speaker device of example 7, wherein the third throttling scheme reduces the amount of power supplied to the audio-power integrated circuit components from a moderate-power level of approximately 7.0 watts to a low-power level of approximately 4.4 watts.

Example 9. The electronic speaker device of example 1, wherein the first throttling scheme reduces the amount of power supplied to the SoC integrated circuit component by disabling one or more, but less than all, CPU cores of the SoC integrated circuit component.

Example 10. The electronic speaker device of example 1, wherein the first throttling scheme reduces a utilization of CPU cores of the SoC integrated circuit component.

Example 11. A speaker comprising: one or more speaker modules; a first PCB comprising audio-power integrated circuit components; and a second PCB comprising an SoC integrated circuit component, the SoC integrated circuit component configured to implement a thermal-mitigation module configured to: permit power to be supplied to the audio-power integrated circuit components up to a first amount of power according to a first-level audio-power mode; determine a temperature corresponding to the audio-power integrated circuit components; select a second-level audio-power mode for the audio-power integrated circuit components in response to the temperature corresponding to the audio-power integrated circuit components exceeding a first threshold temperature, the second-level audio-power mode permitting a lesser amount of power to be used than the first-level audio-power mode; and cause the power supplied to the audio-power integrated circuit components to be limited to a second amount of power corresponding to the second audio-power level mode to reduce the power supplied to, and power dissipated by, the audio-power integrated circuit components.

Example 12. The speaker of example 11, wherein the thermal-mitigation module is further configured to: during the second-level audio-power mode of the audio-power integrated circuit components, determine that the temperature corresponding to the audio-power integrated circuit components has exceeded an upper-threshold temperature; select, based on the determination that the temperature corresponding to the audio-power integrated circuit components has exceeded the upper-threshold temperature, a third-level audio-power mode for the audio-power integrated circuit components that permits less power than the second-level audio-power mode; and cause the power supplied to the audio-power integrated circuit components to be limited to a third amount of power corresponding to the third-level audio-power mode to further reduce the power supplied to, and the power dissipated by, the audio-power integrated circuit components.

Example 13. The speaker of example 12, wherein the thermal-mitigation module is further configured to: subsequent to the amount of power supplied to the audio-power integrated circuit components being limited to the third amount of power, determine that the temperature corresponding to the audio-power integrated circuit components has decreased to a value that is below the upper-threshold temperature by more than a tolerance temperature; based on the determination that the temperature corresponding to the audio-power integrated circuit components has decreased to a value that is below the upper-threshold temperature by more than a tolerance temperature, select the second-level audio-power mode for the audio-power integrated circuit components; and permit the power to be supplied to the audio-power integrated circuit components up to the second amount of power corresponding to the second-level audio-power mode to increase the power supplied to the audio-power integrated circuit components.

Example 14. The speaker of example 12, wherein the thermal-mitigation module is further configured to: subsequent to the amount of power supplied to the audio-power integrated circuit components being limited to the third amount of power corresponding to the third-level audio-power mode, determine that the temperature corresponding to the audio-power integrated circuit components has exceeded a critical temperature; and based on the determination that the temperature corresponding to the audio-power integrated circuit components has exceeded the critical temperature, cause the electronic speaker device to reboot to disable the audio-power integrated circuit components and one or more heat-dissipating components of the electronic speaker device.

Example 15. The speaker of example 11, wherein the thermal-mitigation module is further configured to: subsequent to the amount of power supplied to the audio-power integrated circuit components being limited to the second amount of power, determine that the temperature corresponding to the audio-power integrated circuit components has decreased at least to a stable-temperature threshold that is less than the first temperature threshold; and based on the determination that the temperature corresponding to the audio-power integrated circuit components has decreased at least to the stable-temperature threshold that is below the first temperature threshold, select the first-level audio-power mode for the audio-power integrated circuit components; and permit the power to be supplied to the audio-power integrated circuit components up to the first amount of power corresponding to the first-level audio-power mode to increase the power supplied to the audio-power integrated circuit components and increase an output volume of the one or more speaker modules.

Example 16. The speaker of example 11, wherein the first-level audio-power mode uses up to approximately 9.0 watts and the second-level audio-power mode uses up to approximately 7.0 watts.

Example 17. The speaker of example 11, wherein the temperature corresponding to the audio-power integrated circuit components is determined using one or more thermal sensors mounted on the first PCB.

Example 18. A method for thermal mitigation of an electronic speaker device, the method comprising: determining a first temperature corresponding to an SoC integrated circuit component of the electronic speaker device, a second temperature corresponding to a temperature of an exterior surface of a housing component of the electronic speaker device, and a third temperature corresponding to audio-power integrated circuit components of the electronic speaker device; and triggering: a first throttling scheme to reduce power supplied to the SoC integrated circuit component in response to an indication that the first temperature has exceeded a first threshold temperature or the second temperature has exceeded a second threshold temperature; or a second throttling scheme to reduce power supplied to the audio-power integrated circuit components in response to an indication that the third temperature has exceeded a third threshold temperature.

Example 19. The method of example 18, wherein the first throttling scheme includes disabling one or two cores of the SoC integrated circuit component.

Example 20. The method of example 18, wherein the second throttling scheme includes reducing power supplied to the audio-power integrated circuit components from approximately 9.0 watts to approximately 7.0 watts, the method further comprising: subsequent to triggering the second throttling scheme, determining that the third temperature has exceeded a fourth threshold temperature that is higher than the third threshold temperature; and responsive to determining that the third temperature has exceeded the fourth threshold temperature, triggering a third throttling scheme that reduces the power supplied to the audio-power integrated circuit components from approximately 7.0 watts to approximately 4.4 watts.

What is claimed:

1. An electronic device comprising:
    a housing component;
    a System-on-Chip (SoC) integrated circuit component; and
    one or more other circuit components;
    wherein the SoC integrated circuit component is configured to perform operations comprising:
        determining a first temperature corresponding to a first thermal zone and a second temperature corresponding to a second thermal zone, wherein:
            each of the first thermal zone and the second thermal zone includes one selected from a group consisting of the SoC integrated circuit component, a temperature of an exterior surface of the housing component, and the one or more other circuit components; and
            the first thermal zone is different from the second thermal zone;
        based at least in part on the first temperature and the second temperature, using a cascading set of throttling schemes to perform thermal mitigation at least in part by:
            in response to an indication that the first temperature has exceeded a first threshold temperature or the second temperature has exceeded a second threshold temperature, triggering a first throttling scheme; and
            after the triggering of the first throttling scheme and after determining that a temperature corresponding to the first thermal zone does not exceed the first temperature threshold or a temperature corresponding to the second thermal zone does not exceed the second temperature threshold, triggering a second throttling scheme in response to an indication that a third temperature has exceeded a third threshold temperature, where the third temperature corresponds to a third thermal zone, wherein:
                the third thermal zone includes one selected from the group consisting of the SoC integrated circuit component, a temperature of an exterior surface of the housing component, and the one or more other circuit components; and
                the third thermal zone is different from the first thermal zone and the second thermal zone;
        wherein one of the first throttling scheme and the second throttling scheme comprises reducing an amount of power supplied to the SoC integrated circuit component by disabling one or more, but less than all, computer processing unit (CPU) cores of the SoC integrated circuit component; and
        wherein another of the first throttling scheme and the second throttling scheme comprises reducing an amount of power supplied to the one or more other circuit components.

2. The electronic device as recited in claim 1, wherein the first temperature corresponding to the first thermal zone is determined using a junction temperature of the SoC integrated circuit component.

3. The electronic device as recited in claim 2, wherein the third temperature corresponding to the third thermal zone is determined using one or more thermal sensors.

4. The electronic device as recited in claim 3, wherein the temperature of the exterior surface of the housing component is estimated using a virtual sensor that uses an aggregation of temperature measurements from the junction temperature of the SoC integrated circuit component, the one or more thermal sensors, and additional temperature sensors on a main logic board of the electronic device.

5. The electronic device as recited in claim 1, wherein the first throttling scheme or the second throttling scheme reduces a utilization of at least one of the CPU cores of the SoC integrated circuit component.

6. The electronic device as recited in claim 1, wherein the first throttling scheme includes disabling at least two cores of the SoC integrated circuit component.

7. The electronic device as recited in claim 1, the operations further comprising:
responsive to an additional indication that the third temperature has exceeded a fourth threshold temperature that is higher than the third threshold temperature, triggering a third throttling scheme that further reduces the amount of power supplied to the one or more other circuit components, wherein: the one or more other circuit components comprise one or more audio-power integrated circuit components that are electrically coupled to one or more speaker modules of the electronic device, a first printed circuit board of the electronic device comprises the one or more other circuit components, and a second printed circuit board of the electronic device comprises the SoC integrated circuit component.

8. A method comprising:
determining a first temperature corresponding to a first thermal zone of an electronic device;
determining a second temperature corresponding to a second thermal zone of the electronic device, wherein;
each of the first thermal zone and the second thermal zone includes one selected from a group consisting of a System-on-Chip (SoC) the SoC integrated circuit component of the electronic device, a temperature of an exterior surface of a housing component of the electronic device, and one or more other circuit components of the electronic device; and
the first thermal zone is different from the second thermal zone;
based at least in part on the first temperature and the second temperature, using a cascading set of throttling schemes to perform thermal mitigation at least in part by:
in response to an indication that the first temperature has exceeded a first threshold temperature or the second temperature has exceeded a second threshold temperature, triggering a first throttling scheme; and
after the triggering of the first throttling scheme and after determining that a temperature corresponding to the first thermal zone does not exceed the first temperature threshold or a temperature corresponding to the second thermal zone does not exceed the second temperature threshold, triggering a second throttling scheme in response to an indication that a third temperature has exceeded a third threshold temperature, where the third temperature corresponds to a third thermal zone, wherein:
the third thermal zone includes one selected from the group consisting of the SoC integrated circuit component, a temperature of an exterior surface of the housing component, and the one or more other circuit components; and
the third thermal zone is different from the first thermal zone and the second thermal zone;
wherein one of the first throttling scheme and the second throttling scheme comprises reducing an amount of power supplied to the SoC integrated circuit component by disabling one or more, but less than all, computer processing unit (CPU) cores of the SoC integrated circuit component; and
wherein another of the first throttling scheme and the second throttling scheme comprises reducing an amount of power supplied to the one or more other circuit components.

9. The method as recited in claim 8, wherein the first temperature corresponding to the first thermal zone is determined using a junction temperature of the SoC integrated circuit component.

10. The method as recited in claim 9, wherein the third temperature corresponding to the third thermal zone is determined using one or more thermal sensors.

11. The method as recited in claim 10, wherein the temperature of the exterior surface of the housing component is estimated using a virtual sensor that uses an aggregation of temperature measurements from the junction temperature of the SoC integrated circuit component, the one or more thermal sensors, and additional temperature sensors on a main logic board.

12. The method as recited in claim 8, wherein the first throttling scheme or the second throttling scheme reduces a utilization of at least one of the CPU cores of the SoC integrated circuit component.

13. The method as recited in claim 8, wherein the first throttling scheme includes disabling at least two cores of the SoC integrated circuit component.

14. The method as recited in claim 8, further comprising:
responsive to an additional indication that the third temperature has exceeded a fourth threshold temperature that is higher than the third threshold temperature, triggering a third throttling scheme that further reduces the amount of power supplied to the one or more other circuit components.

15. A non-transitory, processor-readable medium comprising processor-executable instructions that, when executed by one or more processing devices, cause the one or more processing devices to perform operations comprising:
determining a first temperature corresponding to a first thermal zone of an electronic device;
determining a second temperature corresponding to a second thermal zone of the electronic device, wherein:
each of the first thermal zone and the second thermal zone includes one selected from a group consisting of a System-on-Chip (SoC) integrated circuit component of the electronic device, a temperature of an exterior surface of a housing component of the electronic device, and one or more other circuit components of the electronic device; and
the first thermal zone is different from the second thermal zone;
based at least in part on the first temperature and the second temperature, using a cascading set of throttling schemes to perform thermal mitigation at least in part by:
in response to an indication that the first temperature has exceeded a first threshold temperature or the second temperature has exceeded a second threshold temperature, triggering a first throttling scheme; and
after the triggering of the first throttling scheme and after determining that a temperature corresponding to the first thermal zone does not exceed the first temperature threshold or a temperature corresponding to the second thermal zone does not exceed the second temperature threshold, triggering a second throttling scheme in response to an indication that a third temperature has exceeded a third threshold temperature, where the third temperature corresponds to a third thermal zone;

wherein one of the first throttling scheme and the second throttling scheme comprises reducing an amount of power supplied to the SoC integrated circuit component by disabling one or more, but less than all, computer processing unit (CPU) cores of the SoC integrated circuit component, wherein:

the third thermal zone includes one selected from the group consisting of the SoC integrated circuit component, a temperature of an exterior surface of the housing component, and the one or more other circuit components; and the third thermal zone is different from the first thermal zone and the second thermal zone; and wherein another of the first throttling scheme and the second throttling scheme comprises reducing an amount of power supplied to the one or more other circuit components.

16. The non-transitory, processor-readable medium as recited in claim 15, wherein the first temperature corresponding to the first thermal zone is determined using a junction temperature of the SoC integrated circuit component.

17. The non-transitory, processor-readable medium as recited in claim 16, wherein the third temperature corresponding to the third thermal zone is determined using one or more thermal sensors.

18. The non-transitory, processor-readable medium as recited in claim 17, wherein the temperature of the exterior surface of the housing component is estimated using a virtual sensor that uses an aggregation of temperature measurements from the junction temperature of the SoC integrated circuit component, the one or more thermal sensors, and additional temperature sensors on a main logic board.

19. The non-transitory, processor-readable medium as recited in claim 15, wherein the first throttling scheme or the second throttling scheme reduces a utilization of at least one of the CPU cores of the SoC integrated circuit component.

20. The non-transitory, processor-readable medium as recited in claim 15, wherein the first throttling scheme includes disabling at least two cores of the SoC integrated circuit component.

* * * * *